United States Patent
Peng et al.

(10) Patent No.: US 11,609,249 B2
(45) Date of Patent: Mar. 21, 2023

(54) VOLTAGE STATE DETECTOR

(71) Applicant: RichWave Technology Corp., Taipei (TW)

(72) Inventors: Tien-Yun Peng, Taipei (TW); Hsien-Huang Tsai, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 79 days.

(21) Appl. No.: 17/138,785

(22) Filed: Dec. 30, 2020

(65) Prior Publication Data

US 2022/0163573 A1    May 26, 2022

(30) Foreign Application Priority Data

Nov. 23, 2020   (TW) .................................. 109140948
Dec. 8, 2020    (TW) .................................. 109143129

(51) Int. Cl.
*G01R 19/00*     (2006.01)
*H03K 19/20*     (2006.01)

(52) U.S. Cl.
CPC ......... *G01R 19/0046* (2013.01); *H03K 19/20* (2013.01)

(58) Field of Classification Search
CPC ............................. G01R 19/0046; H03K 19/20
See application file for complete search history.

(56) References Cited

U.S. PATENT DOCUMENTS

| | | | | |
|---|---|---|---|---|
| 5,181,187 A * | 1/1993 | Jenq | ....................... | G11C 16/30 365/182 |
| 6,184,724 B1 * | 2/2001 | Lin | ...................... | H03K 17/302 327/143 |
| 7,271,624 B2 * | 9/2007 | Zolfaghari | ............. | H03K 5/082 327/143 |
| 2007/0057698 A1 | 3/2007 | Verbauwhede | | |
| 2018/0267567 A1 | 9/2018 | Lo | | |

FOREIGN PATENT DOCUMENTS

| | | |
|---|---|---|
| CN | 108628426 A | 10/2018 |
| TW | I610527 B | 1/2018 |
| TW | I707542 B | 10/2020 |

* cited by examiner

*Primary Examiner* — Walter L Lindsay, Jr.
*Assistant Examiner* — Milton Gonzalez
(74) *Attorney, Agent, or Firm* — Winston Hsu

(57) ABSTRACT

A voltage state detector includes an input terminal, a voltage drop circuit, a pull-down circuit, a load circuit, a transistor, a pull-up circuit, a first output terminal, and a second output terminal. The voltage drop circuit is coupled to the input terminal. The pull-down circuit is coupled to the voltage drop circuit and a first reference terminal. The load circuit is coupled to a second reference terminal. The transistor has a first terminal coupled to the load circuit, a second terminal coupled to the first reference terminal, and a control terminal coupled to the voltage drop circuit. The pull-up circuit is coupled to the second reference terminal and the voltage drop circuit. The first output terminal is coupled to the first terminal of the transistor for outputting a first state determination signal. The second output terminal is coupled to the voltage drop circuit for outputting a second state determination signal.

16 Claims, 8 Drawing Sheets

FIG. 3 Replacement sheet

VOLTAGE STATE DETECTOR

CROSS REFERENCE TO RELATED APPLICATION

This non-provisional application claims priority of Taiwan patent application No. 109140948, filed on 23 Nov. 2020, and Taiwan patent application No. 109143129, filed on 8 Dec. 2020, included herein by reference in its entirety.

TECHNICAL FIELD

The present invention relates to a voltage state detector, and in particular, a voltage state detector capable of determining a floating state.

BACKGROUND

In electronic designs, a voltage state detector is often used to determine a voltage state of a node of interest, or to determine a voltage state of a circuit or a component related to the node of interest. However, in the related art, the conventional voltage state detector can only determine a predetermined fixed potential, but not a floating state. Therefore, the applications of the conventional voltage state detector are very limited.

SUMMARY

According to one embodiment of the invention, a voltage state detector includes an input terminal, a voltage drop circuit, a pull-down circuit, a first load circuit, a first transistor, a pull-up circuit, a first output terminal, and a second output terminal. The voltage drop circuit includes a first terminal coupled to the input terminal, and a second terminal. The pull-down circuit includes a first terminal coupled to the second terminal of the voltage drop circuit, and a second terminal coupled to a first reference terminal. The first load circuit includes a first terminal coupled to a second reference terminal, and a second terminal. The first transistor includes a first terminal coupled to the second terminal of the first load circuit, a second terminal coupled to the first reference terminal, and a control terminal. The pull-up circuit includes a first terminal coupled to the second reference terminal, and a second terminal coupled to the first terminal of the voltage drop circuit. The first output terminal is coupled to the first terminal of the first transistor, and is used to output a first state determination signal. The second output terminal is used to output a second state determination signal. The control terminal of the first transistor is coupled to the second terminal of the voltage drop circuit and the second output terminal is coupled to the first terminal of the voltage drop circuit, or the control terminal of the first transistor is coupled to the first terminal of the voltage drop circuit and the second output terminal is coupled to the second terminal of the voltage drop circuit. The first state determination signal and the second state determination signal are used to determine a voltage state of the input terminal.

DETAILED DESCRIPTION

Figure 1:
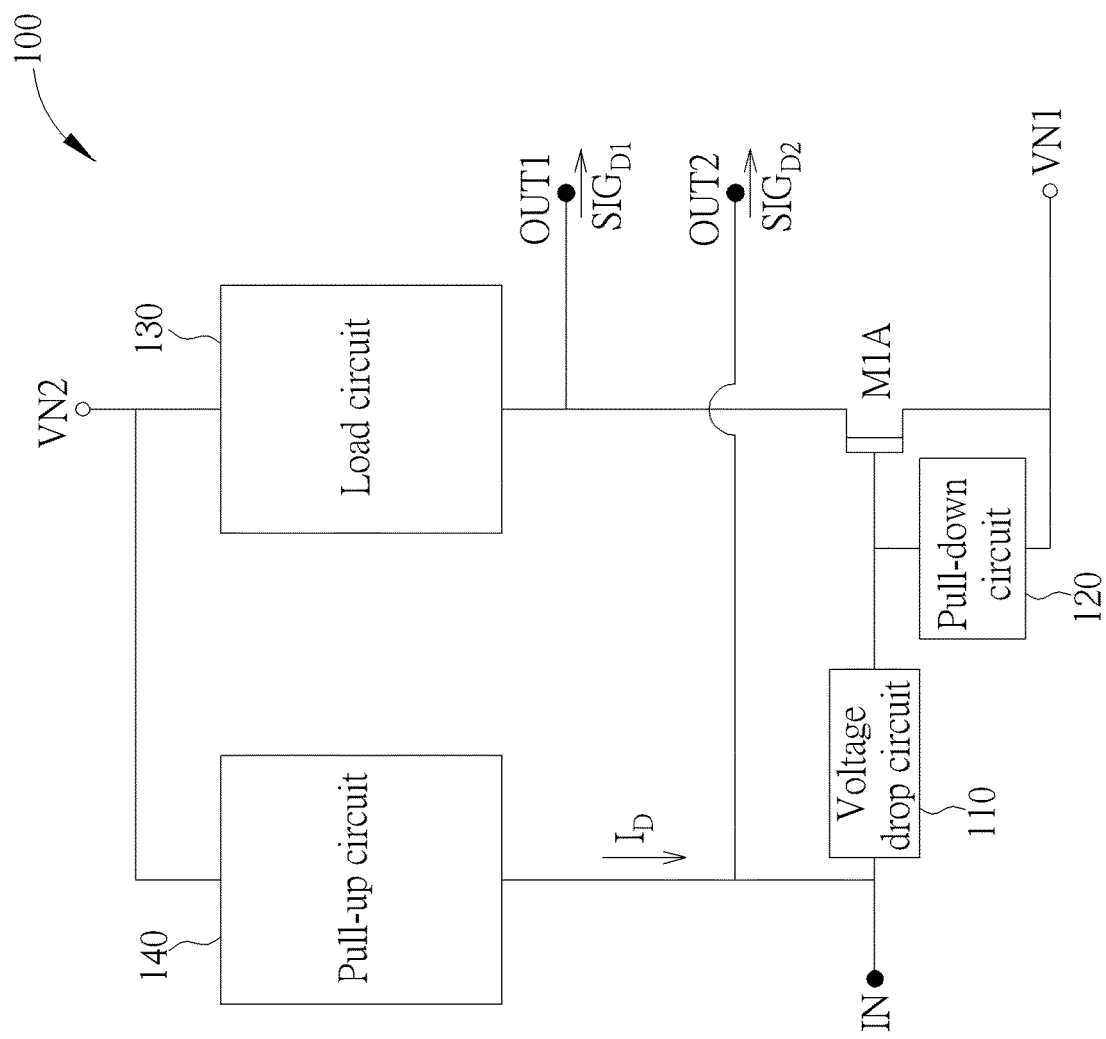
FIG. 1 is a schematic diagram of a voltage state detector according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a schematic diagram of a voltage state detector 100 according to an embodiment of the invention. The voltage state detector 100 includes an input terminal IN, an output terminal OUT1, an output terminal OUT2, a voltage drop circuit 110, a pull-down circuit 120, a load circuit 130, a transistor M1A and a pull-up circuit 140.

The voltage drop circuit 110 has a first terminal and a second terminal, and the first terminal of the voltage drop circuit 110 is coupled to the input terminal IN. When a current flows through the voltage drop circuit 110, the voltage drop circuit 110 will generate accordingly a voltage drop between the first terminal and the second terminal thereof.

The pull-down circuit 120 has a first terminal and a second terminal. The first terminal of the pull-down circuit 120 is coupled to the second terminal of the voltage drop circuit 110, and the second terminal of the pull-down circuit 120 is coupled to a reference terminal VN1.

The load circuit 130 has a first terminal and a second terminal. The first terminal of the load circuit 130 is coupled to a reference terminal VN2.

The transistor M1A has a first terminal, a second terminal and a control terminal. The first terminal of the transistor M1A is coupled to the second terminal of the load circuit 130, the second terminal of the transistor M1A is coupled to the reference terminal VN1, and the control terminal of the transistor M1A is coupled to the second terminal of the voltage drop circuit 110.

The pull-up circuit 140 has a first terminal and a second terminal. The first terminal of the pull-up circuit 140 is coupled to the reference terminal VN2, and the second terminal of the pull-up circuit 140 is coupled to the first terminal of the voltage drop circuit 110. In some embodiments, a voltage at the reference terminal VN2 may be higher than a voltage at the reference terminal VN1. For example, the voltage at the reference terminal VN2 may be, but is not limited to, an operating voltage in the system, and the voltage at the reference terminal VN1 may be, but is not limited to, a ground voltage in the system.

The output terminal OUT1 is coupled to the first terminal of the transistor M1A, and may output a state determination signal $SIG_{D1}$. The output terminal OUT2 is coupled to the first terminal of the voltage drop circuit 110, and may output a state determination signal $SIG_{D2}$. The voltage state detector 100 may output different voltage levels of the state determination signals $SIG_{D1}$ and $SIG_{D2}$ according to a voltage state of the input terminal IN. In other words, the state determination signals $SIG_{D1}$ and $SIG_{D2}$ are used to determine the voltage state of the input terminal IN. In some embodiments, the input terminal IN may be coupled to a node of interest, so as to determine the voltage state of the node of interest or determine the voltage state of a circuit or a component related to the node of interest.

For example, when the voltage state of the input terminal IN is in a floating state, provided that a detection current $I_D$ is appropriate in size, the detection current $I_D$ will flow through the pull-up circuit 140, the voltage drop circuit 110 and the pull-down circuit 120, the pull-up circuit 140 will accordingly produce a voltage drop, a voltage at the output terminal OUT2 will be equal to a difference between the voltage at the reference terminal VN2 and the voltage drop across the pull-up circuit 140, and the terminal OUT2 will output the state determination signal $SIG_{D2}$ having a high voltage level. The voltage received by the control terminal of the transistor M1A may be a fraction of the voltage at the output terminal OUT2 generated by the voltage drop circuit 110 and the pull-down circuit 120. Therefore, the control terminal of the transistor M1A will receive a sufficiently low voltage to turn off the transistor M1A. In such a case, a voltage at the output terminal OUT1 may be regarded as the voltage at the reference terminal VN2, and therefore, the output terminal OUT1 may also output the state determination signal $SIG_{D1}$ having a high voltage level.

However, when the voltage state of the input terminal IN is in a high voltage state, provided that the detection current $I_D$ is appropriate in size, the voltage received by the control terminal of the transistor M1A may be equal to a fractional voltage of a high voltage at the input terminal IN generated by the voltage drop circuit 110 and the pull-down circuit 120, so as to provide a sufficiently high voltage to the control terminal of the transistor M1A to turn on the transistor M1A. In such a case, the voltage at the output terminal OUT1 may be pulled down by the transistor M1A to approach the voltage at the reference terminal VN1, and therefore, the output terminal OUT1 to output the state determination signal $SIG_{D1}$ having a low voltage level. Further, the voltage at the output terminal OUT2 may be dominated by the high voltage at the input terminal IN, and thus, the output terminal OUT2 may output the state determination signal $SIG_{D2}$ having the high voltage level.

Furthermore, when the voltage state of the input terminal IN is in a low voltage state, provided that the detection current $I_D$ is appropriate in size, the voltage received by the control terminal of the transistor M1A may be a fractional voltage of a low voltage at the input terminal IN generated by the voltage drop circuit 110 and the pull-down circuit 120, so as to provide a sufficiently low voltage to the control terminal of the transistor M1A to turn off the transistor M1A. In such a case, the voltage at the output terminal OUT1 may be regarded as the voltage at the reference terminal VN2, and therefore, the output terminal OUT1 may output the state determination signal $SIG_{D1}$ having the high voltage level. Further, the voltage at the output terminal OUT2 may be dominated by the low voltage at the input terminal IN, and thus, the output terminal OUT2 may output the state determination signal $SIG_{D2}$ having a low voltage level.

In this manner, the voltage state of the input terminal IN may be determined by the state determination signals $SIG_{D1}$ and $SIG_{D2}$. In other words, when the state determination signals $SIG_{D1}$ and $SIG_{D2}$ are both at the high voltage levels, the voltage state of the input terminal IN is in the floating state. When the state determination signals $SIG_{D1}$ and $SIG_{D2}$ are at different voltage levels, the voltage state of the input terminal IN is in the high voltage state or the low voltage state.

The value of the detection current $I_D$ may be configured in a way that will allow the voltage at the control terminal of the transistor M1A to be raised to the sufficiently high level to turn on the transistor M1A when the voltage state of the input terminal IN is in the high voltage state, and allow the voltage at the control terminal of the transistor M1A to be adjusted to the sufficiently low level to turn off the transistor M1A when the voltage state of the input terminal IN is in the low voltage state or in the floating state. In some embodiments, the pull-up circuit 140, the voltage drop circuit 110 and the pull-down circuit 120 may be designed properly to generate the detection current $I_D$ in appropriate size.

Figure 2:
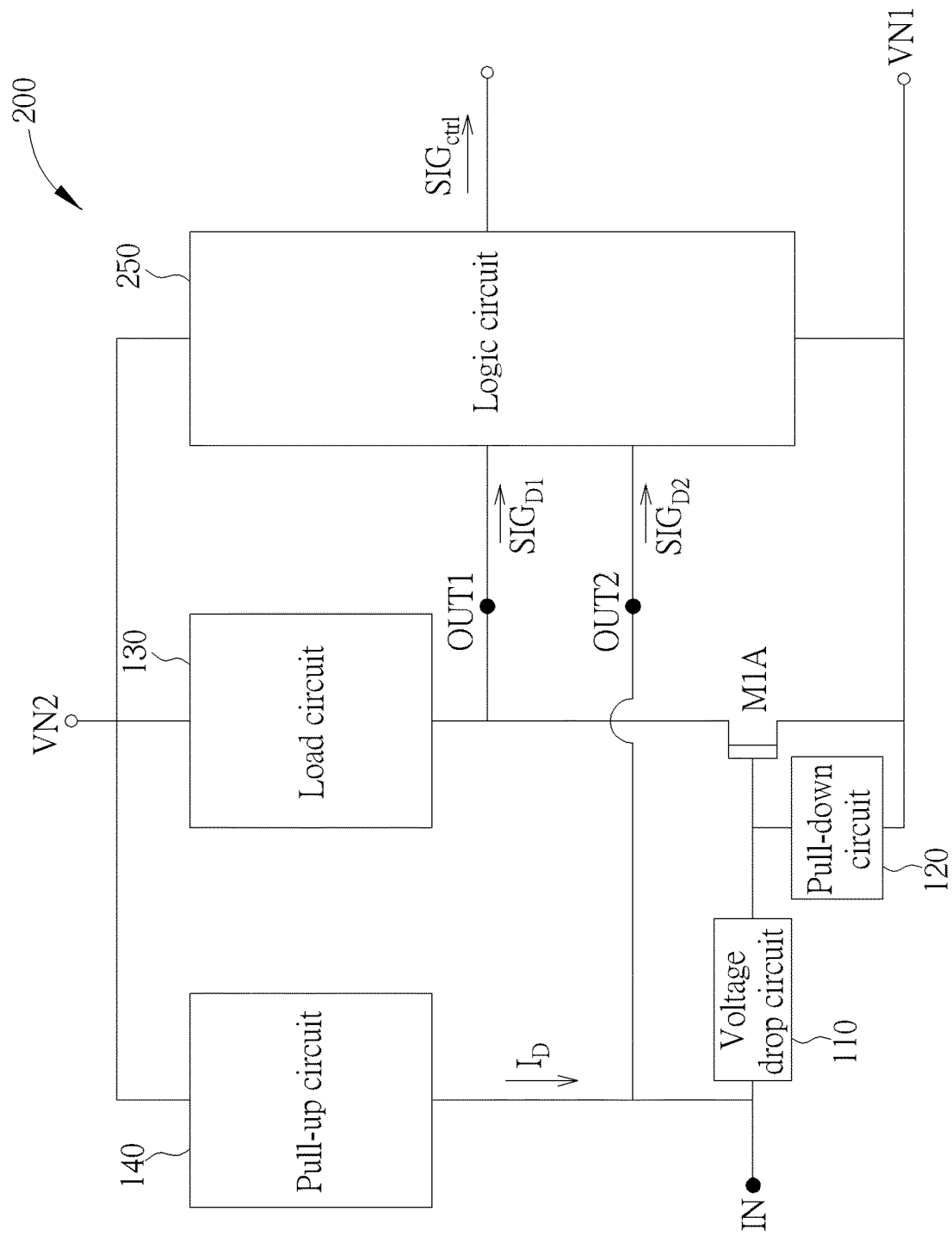
FIG. 2 is a schematic diagram of a voltage state detector according to another embodiment of the invention.

FIG. 2 is a schematic diagram of a voltage state detector 200 according to another embodiment of the invention. The voltage state detector 200 and the voltage state detector 100 are similar in structure and may operate on similar principles. The voltage state detector 200 may further include a logic circuit 250.

The logic circuit 250 may be coupled to the output terminals OUT1 and OUT2 to generate a control signal $SIG_{ctrl}$ related to the voltage state of the input terminal IN according to the state determination signals $SIG_{D1}$ and $SIG_{D2}$. In other words, the voltage state detector 200 may employ the logic circuit 250 to output different voltage levels of the control signal $SIG_{ctrl}$ according to the voltage state of the input terminal IN, thereby determining the voltage state of the input terminal IN.

Figure 3:
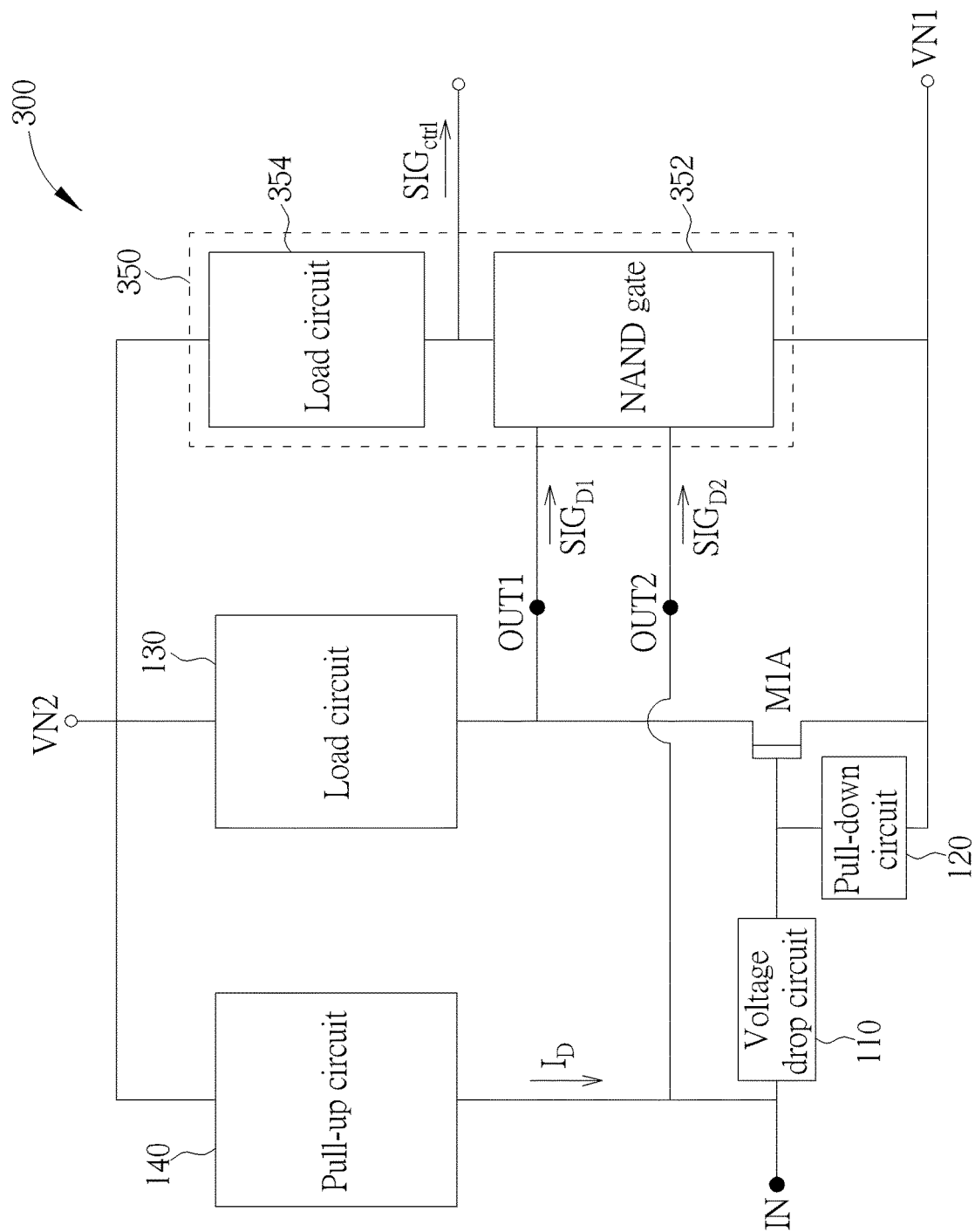
FIG. 3 is a schematic diagram of a voltage state detector according to another embodiment of the invention.

FIG. 3 is a schematic diagram of a voltage state detector 300 according to another embodiment of the invention. The voltage state detector 300 and the voltage state detector 200 are similar in structure and may operate on similar principles. A logic circuit 350 of the voltage state detector 300 may include a NAND gate 352 and a load circuit 354.

The NAND gate 352 has a first input terminal, a second input terminal and an output terminal. The first input terminal of the NAND gate 352 is coupled to the output terminal OUT1, the second input terminal of the NAND gate 352 is coupled to the output terminal OUT2, and the output terminal of the NAND gate 352 is used to output the control signal $SIG_{ctrl}$.

The load circuit 354 has a first terminal and a second terminal. The first terminal of the load circuit 354 is coupled to the reference terminal VN2, and the second terminal of the load circuit 354 is coupled to the output terminal of the NAND gate 352.

The voltage state detector 300 may output different voltage levels of the control signals $SIG_{ctrl}$ according to the voltage state of the input terminal IN. For example, according to FIG. 1, when the voltage state of the input terminal IN is in the floating state, the output terminal OUT1 will output the state determination signal $SIG_{D1}$ having the high voltage level, and the output terminal OUT2 will output the state determination signal $SIG_{D2}$ having the high voltage level. As a result, the output terminal of the NAND gate 352 may output the control signal $SIG_{ctrl}$ having a low voltage level.

Further, when the voltage state of the input terminal IN is in the high voltage state, the output terminal OUT1 will output the state determination signal $SIG_{D1}$ having the low voltage level, and the output terminal OUT2 will output the state determination signal $SIG_{D2}$ having the high voltage level. As a result, the output terminal of the NAND gate 352 may output the control signal $SIG_{ctrl}$ having a high voltage level.

Furthermore, when the voltage state of the input terminal IN is in the low voltage state, the output terminal OUT1 will output the state determination signal $SIG_{D1}$ having the high voltage level, and the output terminal OUT2 will output the state determination signal $SIG_{D2}$ having the low voltage level. As a result, the output terminal of the NAND gate 352 may output the control signal $SIG_{ctrl}$ having the high voltage level.

In other words, the voltage state of the input terminal IN may be determined by the control signal $SIG_{ctrl}$. In FIG. 3, when the control signal $SIG_{ctrl}$ is at the low voltage level, the voltage state of the input terminal IN is in the floating state. When the control signal $SIG_{ctrl}$ is at the high voltage level, the voltage state of the input terminal IN is in the high voltage state or in the low voltage state. In other embodiments, the logic circuit 350 may also use other logic operations to generate the control signal $SIG_{ctrl}$ to meet the actual operation requirements of the system.

Figure 4:
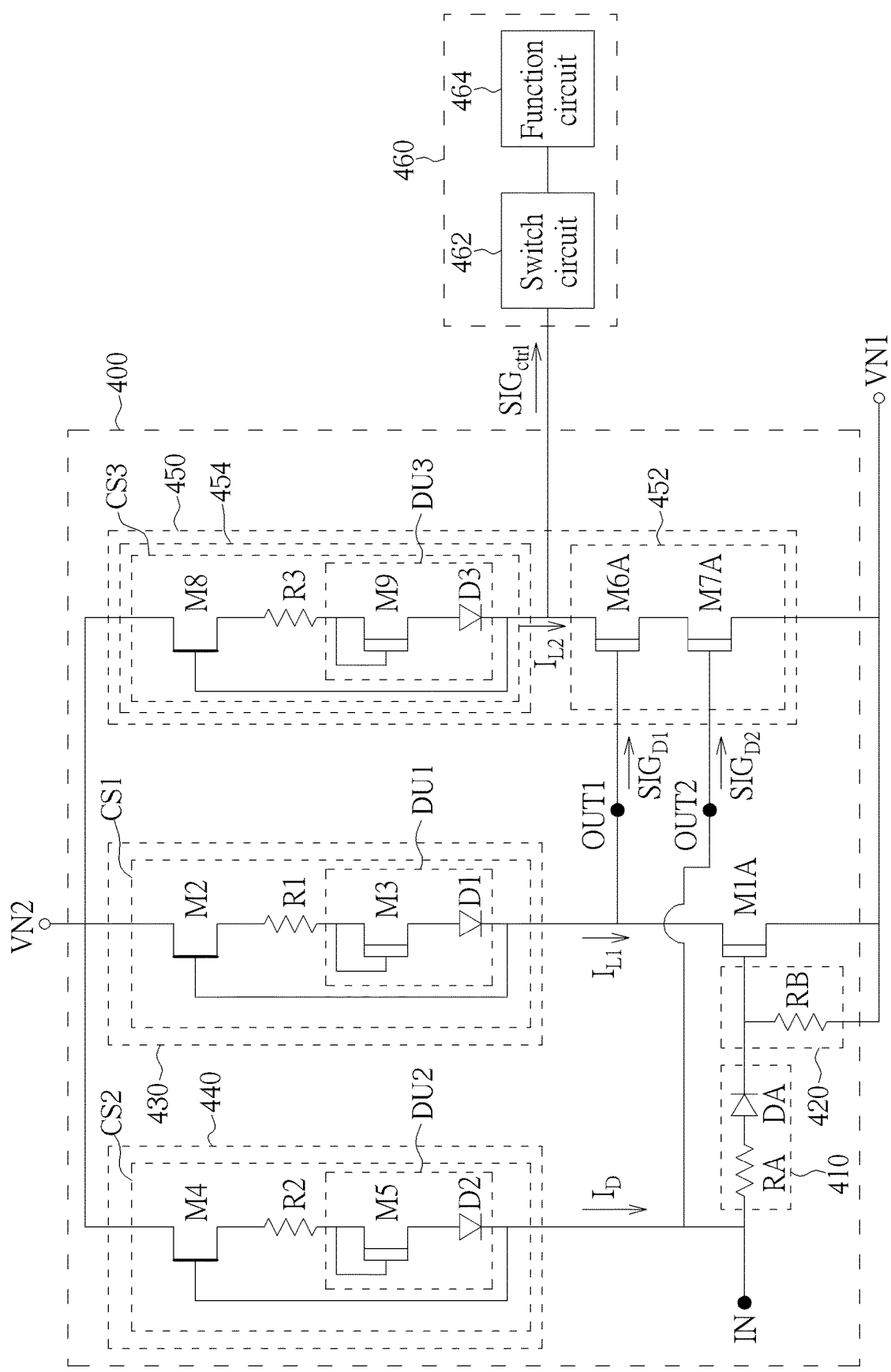
FIG. 4 is an application schematic diagram of a voltage state detector according to an embodiment of the invention.

FIG. 4 is an application schematic diagram of a voltage state detector 400 according to an embodiment of the invention. The voltage state detector 400 may be one of the implementations of the voltage state detector 300 in FIG. 3, and may operate on similar principles. The voltage state detector 400 may include an input terminal IN, an output terminal OUT1, an output terminal OUT2, a voltage drop circuit 410, a pull-down circuit 420, a load circuit 430, the transistor M1A, a pull-up circuit 440 and a logic circuit 450.

The voltage drop circuit 410 may include at least one transistor, at least one diode, at least one resistor, or a combination thereof, and the pull-down circuit 420 may include at least one transistor, at least one diode, at least one resistor or a combination thereof. For example, in FIG. 4, the voltage drop circuit 410 may include a resistor RA and a diode DA coupled in series, and the pull-down circuit 420 may include a resistor RB. In other embodiments, the diode DA may be replaced by a diode-connected transistor.

In some embodiments of the invention, the load circuit 430 may include a current source CS1, and the current source CS1 may include at least one transistor, at least one diode, at least one resistor or a combination thereof. For example, in FIG. 4, the current source CS1 may include a transistor M2 and a resistor R1.

The transistor M2 may be a field effect transistor (FET). In some embodiments of the invention, the transistor M2 may be a depletion mode (D-mode) pseudomorphic high electron mobility transistor (PHEMT). The transistor M2 includes a first terminal, a second terminal and a control terminal. The first terminal of the transistor M2 may be coupled to the first terminal of the load circuit 430. The resistor R1 has a first terminal and a second terminal. The first terminal of the resistor R1 is coupled to the second terminal of the transistor M2, and the second terminal of the resistor R1 may be directly or indirectly coupled to the control terminal of the transistor M2 and the second terminal of the load circuit 430. For example, if the second terminal of the resistor R1 is directly coupled to the control terminal of the transistor M2 and the second terminal of the load circuit 430, and a voltage at the second terminal of the load circuit 430 is pulled down (i.e., that is, the output terminal OUT1 output the state determination signal $SIG_{D1}$ having the low voltage level), the control terminal of the transistor M2 will receive a sufficiently low voltage to turn on the transistor M2. A voltage at the second terminal of the transistor M2 may be equal to a voltage difference between the voltage at the output terminal OUT1 and a voltage difference between the control terminal and the second terminal of the transistor M2. A load current $I_{L1}$ flowing through the current source CS1 may be obtained by dividing the voltage at the second terminal of the transistor M2 by the resistance of the resistor R1. Since the resistance of the resistor R1 is inversely proportional to the load current $I_{L1}$, it is possible to reduce the load current $I_{L1}$ (e.g., to less than 1 μA) by selecting a resistor R1 having a large resistance (e.g., 1 MΩ), thereby reducing the leakage current and power consumption of the voltage state detector 400. However, the large resistor R1 will take up a large area of the voltage state detector 400 (e.g., the circuit area of the current source CS1 will double the original circuit area).

To resolve the issue, the current source CS1 may further include a diode unit DU1. The diode unit DU1 has a first terminal and a second terminal. The first terminal of the diode unit DU1 is coupled to the second terminal of the resistor R1, and the second terminal of the diode unit DU1 is coupled to the control terminal of the transistor M2 and the second terminal of the load circuit 430. That is, the second terminal of the resistor R1 may be indirectly coupled to the control terminal of the transistor M2 and the second terminal of the load circuit 430. The diode unit DU1 may include at least one transistor, at least one diode, or a combination thereof. In some embodiments, at least one transistor and/or at least one diode having smaller sizes may be used. For example, in FIG. 4, the diode unit DU1 may include a transistor M3 and a diode D1. The transistor M3 includes a first terminal, a second terminal and a control terminal. The first terminal of the transistor M3 may be coupled to the first terminal of the diode unit DU1. The diode D1 has a first terminal and a second terminal. The first terminal of the diode D1 is coupled to the second terminal of the transistor M3, and the second terminal of the diode D1 is coupled to the second terminal of the diode unit DU1. Further, the transistor M3 may be diode connected. In some embodiments, the resistor R1, the transistor M3, and the diode D1 may be used for current limiting. In this way, when the voltage at the second terminal of the load circuit 430 is pulled down, the control terminal of the transistor M2 will receive a sufficiently low voltage to turn on the transistor M2. The voltage at the second terminal of the transistor M2 may be equal to the voltage difference between the voltage at the output terminal OUT1 and the voltage difference between the control terminal and the second terminal of the transistor M2. The load current $I_{L1}$ flowing through the current source CS1 may be obtained by computing a difference between the voltage at the second terminal of the transistor M2 and the voltage drop across the transistor M3 and the diode D1, and then dividing the difference by the resistance of the resistor R1. In other words, compared to using a larger resistor R1 to reduce the load current $I_{L1}$ (e.g., to less than 1 μA), by employing the diode unit DU1, a smaller resistor R1 (e.g., 0.4 MΩ) may be adopted to reduce the load current $I_{L1}$ (e.g. less than 1 μA), reducing the circuit area taken up by the current source CS1 in the voltage state detector 400 (e.g., the current source CS1 may take up an additional 0.4 times of the original circuit area). In other embodiments, the diode unit DU1 may be configured according to the value of the required load current $I_{L1}$.

In some embodiments of the invention, the pull-up circuit 440 may include a current source CS2, and the current source CS2 may include at least one transistor, at least one diode, at least one resistor or a combination thereof. For example, in FIG. 4, the current source CS2 may include a transistor M4 and a resistor R2.

The transistor M4 may be a FET. In some embodiments, the transistor M4 may be a D-mode PHEMT. The transistor M4 has a first terminal, a second terminal and a control terminal. The first terminal of the transistor M4 is coupled to the first terminal of the pull-up circuit 440. The resistor R2 has a first terminal and a second terminal. The first terminal of the resistor R2 is coupled to the second terminal of the transistor M4, and the second terminal of the resistor R2 may be directly or indirectly coupled to the control terminal of the transistor M4 and the second terminal of the pull-up circuit 440. For example, if the second terminal of the resistor R2 is directly coupled to the control terminal of the transistor M4 and the second terminal of the pull-up circuit 440, and a voltage at the second terminal of the pull-up circuit 440 is pulled down (i.e., that is, the voltage state of the input terminal IN is in the low voltage state), the control terminal of the transistor M4 will receive a sufficiently low voltage to turn on the transistor M4. A voltage at the second terminal of the transistor M4 may be equal to a voltage difference between the voltage at the input terminal IN and a voltage difference between the control terminal and the second terminal of the transistor M4. The detection current $I_D$ flowing through the current source CS2 may be obtained by dividing the voltage at the second terminal of the transistor M4 by the resistance of the resistor R2. Since the resistance of the resistor R2 is inversely proportional to the detection current $I_D$, it is possible to reduce the detection current $I_D$ (e.g., to less than 1 μA) by selecting a resistor R2 having a large resistance (e.g., 1 MΩ), thereby reducing the leakage current and power consumption of the voltage state detector 400. However, the large resistor R2 will take up a large area of the voltage state detector 400 (e.g., the circuit area of the current source CS2 will double the original circuit area).

To resolve the issue, the current source CS2 may further include a diode unit DU2. The diode unit DU2 has a first terminal and a second terminal. The first terminal of the diode unit DU2 is coupled to the second terminal of the resistor R2, and the second terminal of the diode unit DU2 is coupled to the control terminal of the transistor M4 and the second terminal of the pull-up circuit 440. That is, the second terminal of the resistor R2 may be indirectly coupled to the control terminal of the transistor M4 and the second terminal of the pull-up circuit 440. The diode unit DU2 may include at least one transistor, at least one diode, or a combination thereof. In some embodiments, at least one transistor and/or at least one diode having smaller sizes may be used. For example, in FIG. 4, the diode unit DU2 may include a transistor M5 and a diode D2. The transistor M5 has a first terminal, a second terminal and a control terminal. The first terminal of the transistor M5 may be coupled to the first terminal of the diode unit DU2. The diode D2 has a first terminal and a second terminal. The first terminal of the diode D2 is coupled to the second terminal of the transistor M5, and the second terminal of the diode D2 is coupled to the second terminal of the diode unit DU2. Further, the transistor M5 may be diode connected. In some embodiments, the resistor R2, the transistor M5, and the diode D2 may be used for current limiting. In this way, when the voltage at the second terminal of the pull-up circuit 440 is pulled down, the control terminal of the transistor M4 will receive a sufficiently low voltage to turn on the transistor M4. The voltage at the second terminal of the transistor M4 may be equal to a voltage difference between the voltage at the input terminal IN and a voltage difference between the control terminal and the second terminal of the transistor M4. The detection current $I_D$ flowing through the current source CS2 may be obtained by computing a difference between the voltage at the second terminal of the transistor M4 and the voltage drop across the transistor M5 and the diode D2, and then divided the difference by the resistance of the resistor R2. In other words, compared to using a larger resistor R2 to reduce the detection current $I_D$ (e.g., to less than 1 μA), by employing the diode unit DU2, a smaller resistor R2 (e.g., 0.4 MΩ) may be adopted to reduce the detection current $I_D$ (e.g. less than 1 μA), reducing the circuit area taken up by the current source CS2 in the voltage state detector 400 (e.g., the current source CS2 may take up an additional 0.4 times of the original circuit area). In other embodiments, the diode unit DU2 may be configured according to the value of the detection current $I_D$.

The logic circuit 450 may include an NAND gate 452 and a load circuit 454. The NAND gate 452 may include a transistor M6A and a transistor M7A. The transistor M6A has a first terminal, a second terminal and a control terminal. The first terminal of transistor M6A is coupled to the output terminal of the NAND gate 452, and the control terminal of transistor M6A is coupled to the first input terminal of the NAND gate 452. The transistor M7A has a first terminal, a second terminal and a control terminal. The first terminal of the transistor M7A is coupled to the second terminal of the transistor M6A, the second terminal of the transistor M7A is coupled to the reference terminal VN1, and the control terminal of the transistor M7A is coupled to the second input terminal of the NAND gate 452.

Further, in some embodiments, the load circuit 454 may include a current source CS3, and the current source CS3 may include at least one transistor, at least one diode, at least one resistor or a combination thereof. For example, in FIG. 4, the current source CS3 may include a transistor M8 and a resistor R3.

The transistor M8 may be a FET. In some embodiments, the transistor M8 may be a D-mode PHEMT. The transistor M8 includes a first terminal, a second terminal and a control terminal. The first terminal of the transistor M8 may be coupled to the first terminal of the load circuit 454. The resistor R3 has a first terminal and a second terminal. The first terminal of the resistor R3 is coupled to the second terminal of the transistor M8, and the second terminal of the resistor R3 may be directly or indirectly coupled to the control terminal of the transistor M8 and the second terminal of the load circuit 454. For example, if the second terminal of the resistor R3 is directly coupled to the control terminal of the transistor M8 and the second terminal of the load circuit 454, and the voltage at the second terminal of the load circuit 454 is pulled down (that is, the output terminal of the NAND gate 452 output the control signal $SIG_{ctrl}$ having the low voltage level), the control terminal of the transistor M8 will receive a sufficiently low voltage to turn on the transistor M8. The voltage at the second terminal of the transistor M8 may be equal to a voltage difference between the voltage at the output terminal of the NAND gate 452 and a voltage difference between the control terminal and the second terminal of the transistor M8. A load current $I_{L2}$ flowing through the current source CS3 may be obtained by dividing the voltage at the second terminal of the transistor M8 by the resistance of the resistor R3. Since the resistance of the resistor R3 is inversely proportional to the load current $I_{L2}$, it is possible to reduce the load current $I_{L2}$ (e.g., to less than 1 μA) by selecting a resistor R3 having a large resistance (e.g., 1 MΩ), thereby reducing the leakage current and power consumption of the voltage state detector 400. However, the large resistor R3 will take up a large area of the voltage state detector 400 (e.g., the circuit area of the current source CS3 will double the original circuit area).

To resolve the issue, the current source CS3 may further include a diode unit DU3. The diode unit DU3 has a first terminal and a second terminal. The first terminal of the diode unit DU3 is coupled to the second terminal of the resistor R3, and the second terminal of the diode unit DU3 is coupled to the control terminal of the transistor M8 and the second terminal of the load circuit 454. That is, the second terminal of the resistor R3 may be indirectly coupled to the control terminal of the transistor M8 and the second terminal of the load circuit 454. The diode unit DU3 may include at least one transistor, at least one diode, or a combination thereof. In some embodiments, at least one transistor and/or at least one diode having smaller sizes may be used. For example, in FIG. 4, the diode unit DU3 may include a transistor M9 and a diode D3. The transistor M9 has a first terminal, a second terminal and a control terminal. The first terminal of the transistor M9 may be coupled to the first terminal of the diode unit DU3. The diode D3 has a first terminal and a second terminal. The first terminal of the diode D3 is coupled to the second terminal of the transistor M9, and the second terminal of the diode D3 is coupled to the second terminal of the diode unit DU3. Further, the transistor M9 may be diode connected. In some embodiments, the resistor R3, the transistor M9, and the diode D3 may be used for current limiting. In this way, when the voltage at the second terminal of the load circuit 454 is pulled down, the control terminal of the transistor M8 will receive a sufficiently low voltage to turn on the transistor M8. The voltage at the second terminal of the transistor M8 may be equal to a voltage difference between the voltage at the output terminal of the NAND gate 452 and the voltage difference between the control terminal and the second terminal of the transistor M8. The load current $I_{L2}$ flowing through the current source CS3 may be obtained by computing a voltage difference between the voltage at the second terminal of the transistor M8 and the voltage drop across the transistor M9 and the diode D3 and then dividing the voltage difference by the resistance of the resistor R3. In other words, compared to using a larger resistor R3 to reduce the load current $I_{L2}$ (e.g., to less than 1 µA), by employing the diode unit DU3, a smaller resistor R3 (e.g., 0.4 MΩ) may be adopted to reduce the load current $I_{L2}$ (e.g. less than 1 µA), reducing the circuit area taken up by the current source CS3 in the voltage state detector 400 (e.g., the current source CS3 may take up an additional 0.4 times of the original circuit area). In other embodiments, the diode unit DU3 may be configured according to the value of the required load current $I_{L2}$.

In FIG. 4, when the voltage state of the input terminal IN is in the floating state, the state determination signals $SIG_{D1}$ and $SIG_{D2}$ may be at the high voltage levels, thereby turning on the transistors M6A and M7A. The voltage at the output terminal of the NAND gate 452 may be pulled down by transistors M6A and M7A to approach the voltage at the reference terminal VN1, and consequently, the output terminal of the NAND gate 452 may output the control signal $SIG_{ctrl}$ having the low voltage level.

When the voltage state of the input terminal IN is in the high voltage state, the state determination signal $SIG_{D1}$ may have the low voltage level, and the state determination signal $SIG_{D2}$ may have the high voltage level, and consequently, the transistor M6A may be turned off and the transistor M7A may be turned on. The voltage at the output terminal of the NAND gate 452 may be regarded as the voltage at the reference terminal VN2, and therefore, the output terminal of the NAND gate 452 may output the control signal $SIG_{ctrl}$ having the high voltage level.

When the voltage state of the input terminal IN is in the low voltage state, the state determination signal $SIG_{D1}$ may be at the high voltage level, and the state determination signal $SIG_{D2}$ may be at the low voltage level, and therefore, the transistor M6A may be turned on and the transistor M7A may be turned off. The voltage at the output terminal of the NAND gate 452 may be regarded as the voltage at the reference terminal VN2, and consequently, the output terminal of the NAND gate 452 may output the control signal $SIG_{ctrl}$ having the high voltage level.

In some embodiments, the voltage state detector 400 may provide the control signal $SIG_{ctrl}$ for use in an internal circuit 460. In such a case, the logic circuit 450 in the voltage state detector 400 may be coupled to the internal circuit 460. The internal circuit 460 may include a switch circuit 462 and a function circuit 464. The switch circuit 462 is coupled to the logic circuit 450, and the function circuit 464 is coupled to the switch circuit 462. The function circuit 464 may perform specific functions. For example, the control signal $SIG_{ctrl}$ may also be used to switch the operating state of the internal circuit 460. When the control signal $SIG_{ctrl}$ is at the low voltage level, the switch circuit 462 may be turned off, thereby disabling the function circuit 464. When the control signal $SIG_{ctrl}$ is at the high voltage level, the switch circuit 462 may be turned on to enable the function circuit 464 to perform a specific function. In some embodiments, the voltage state detector 400 and the internal circuit 460 may be provided in the same chip, and the input terminal IN of the voltage state detector 400 may be coupled to a pin of interest in the chip to determine the voltage state of the pin of interest.

In other embodiments, the control signal $SIG_{ctrl}$ output by the voltage state detector 400 is not limited to the application of controlling the internal circuit 460, and may be used by other circuits in other ways, or to interact directly with other circuits.

Figure 5:
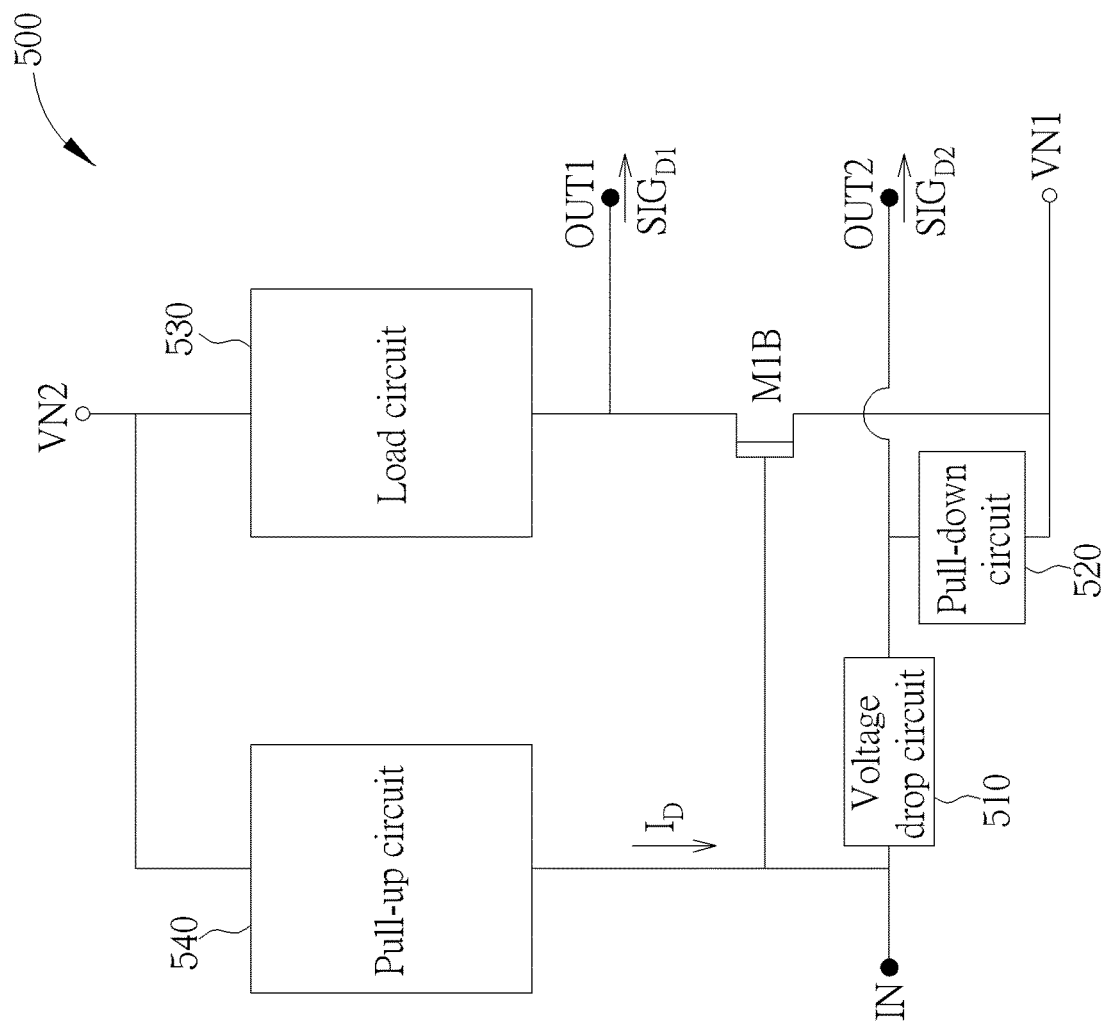
FIG. 5 is a schematic diagram of a voltage state detector according to another embodiment of the invention.

FIG. 5 is a schematic diagram of a voltage state detector 500 according to another embodiment of the invention. The voltage state detector 500 and the voltage state detector 100 may be similar in structures and operate on similar principles. The voltage state detector 500 may include an input terminal IN, an output terminal OUT1, an output terminal OUT2, a voltage drop circuit 510, a pull-down circuit 520, a load circuit 530, a transistor M1B and a pull-up circuit 540. The control terminal of the transistor M1B may be coupled to the first terminal of the voltage drop circuit 510, and the output terminal OUT2 may be coupled to the second terminal of the voltage drop circuit 510.

In the embodiment in FIG. 5, the voltage state detector 500 may output different voltage levels of the state determination signals $SIG_{D1}$ and $SIG_{D2}$ according to a voltage state of the input terminal IN. In other words, the state determination signals $SIG_{D1}$ and $SIG_{D2}$ are used to determine the voltage state of the input terminal IN. In some embodiments, the input terminal IN may be coupled to a node of interest, so as to determine the voltage state of the node of interest or determine the voltage state of a circuit or a component related to the node of interest.

For example, when the voltage state of the input terminal IN is in the floating state, provided that a detection current $I_D$ is appropriate in size, the detection current $I_D$ will flow through the pull-up circuit 540, the voltage drop circuit 510 and the pull-down circuit 520, and the pull-up circuit 540 will accordingly generate a voltage drop, the voltage received by the control terminal of the transistor M1B may be equal to a difference between the voltage at the reference terminal VN2 and the voltage drop across the pull-up circuit 540, and therefore, the control terminal of the transistor M1B may receive a sufficiently high voltage to turn on the transistor M1B. In such a case, the voltage at the output terminal OUT1 may be pulled down by the transistor M1B to approach the voltage at the reference terminal VN1, and therefore, the output terminal OUT1 to output the state determination signal $SIG_{D1}$ having a low voltage level. In addition, the voltage at the output terminal OUT2 may be a fractional voltage of the voltage at the control terminal of the transistor M1B generated by the voltage drop circuit 510 and the pull-down circuit 520, and consequently, the output terminal OUT2 may also output the state determination signal $SIG_{D2}$ having a low voltage level.

When the voltage state of the input terminal IN is in the high voltage state, the voltage received by the control terminal of the transistor M1B is the high voltage at the input terminal IN, and as a consequence, the transistor M1B may be turned on. In such a case, the voltage at the output terminal OUT1 may be pulled down by the transistor M1B to approach the voltage at the reference terminal VN1, and therefore, the output terminal OUT1 to output the state determination signal $SIG_{D1}$ having the low voltage level. When the detection current $I_D$ is appropriate in size, the voltage at the output terminal OUT2 may be a fractional voltage of the high voltage at input terminal IN generated by the voltage drop circuit 510 and the pull-down circuit 520, and consequently, the output terminal OUT2 may output the state determination signal $SIG_{D2}$ having a high voltage level.

Furthermore, when the voltage state of the input terminal IN is in the low voltage state, the voltage received by the control terminal of the transistor M1B is the low voltage at the input terminal IN, and as a consequence, the transistor M1B may be turned off. In such a case, the voltage at the output terminal OUT1 may be regarded as a voltage at the reference terminal VN2, and therefore, the output terminal OUT1 may output the state determination signal $SIG_{D1}$ having a high voltage level. When the detection current $I_D$ is appropriate in size, the voltage at the output terminal OUT2 may be a fractional voltage of the low voltage at the input terminal IN generated by the voltage drop circuit 510 and the pull-down circuit 520, so as to output the state determination signal $SIG_{D2}$ having the low voltage level at the output terminal OUT2.

In this manner, the voltage state of the input terminal IN may be determined by the state determination signals $SIG_{D1}$ and $SIG_{D2}$. In other words, when the state determination signals $SIG_{D1}$ and $SIG_{D2}$ are both at the low voltage levels, the voltage state of the input terminal IN is in the floating state. When the state determination signals SIGD1 and SIGD2 are at different voltage levels, the voltage state of the input terminal IN is in the high voltage state or the low voltage state.

The value of the detection current $I_D$ may be configured in a way that will allow the output terminal OUT2 to be set at a high voltage when the voltage state of the input terminal IN is in a high voltage state, and the output terminal OUT2 to be set at a low voltage when the voltage state of the input terminal IN is in the low voltage state or a floating state. Moreover, if the voltage state of the input terminal IN is in the floating state, the detection current $I_D$ will cause the voltage at the control terminal of the transistor M1B to be raised to a sufficiently high level to turn on the transistor M1B. In some embodiments, the pull-up circuit 540, the voltage drop circuit 510 and the pull-down circuit 520 may be configured properly to generate the detection current $I_D$ in appropriate size.

Figure 6:
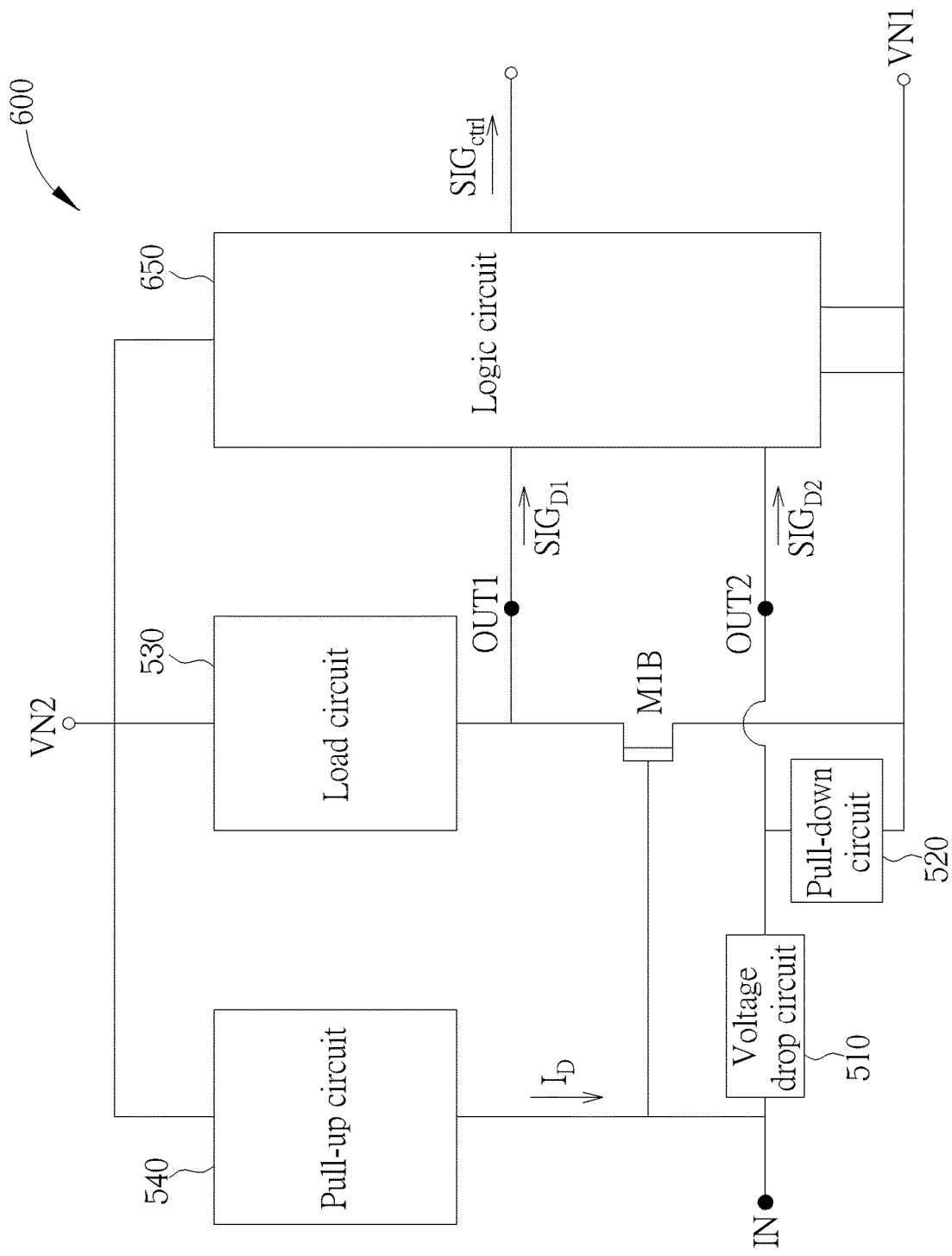
FIG. 6 is a schematic diagram of a voltage state detector according to another embodiment of the invention.

FIG. 6 is a schematic diagram of a voltage state detector 600 according to another embodiment of the invention. The voltage state detector 600 and the voltage state detector 500 are similar in structure and may operate on similar principles. The voltage state detector 600 may further include a logic circuit 650.

The logic circuit 650 may be coupled to the output terminals OUT1 and OUT2 to generate a control signal $SIG_{ctrl}$ related to the voltage state of the input terminal IN according to the state determination signals $SIG_{D1}$ and $SIG_{D2}$. In other words, the voltage state detector 600 may employ the logic circuit 650 to output different voltage levels of the control signal $SIG_{ctrl}$ according to the voltage state of the input terminal IN, thereby determining the voltage state of the input terminal IN.

Figure 7:
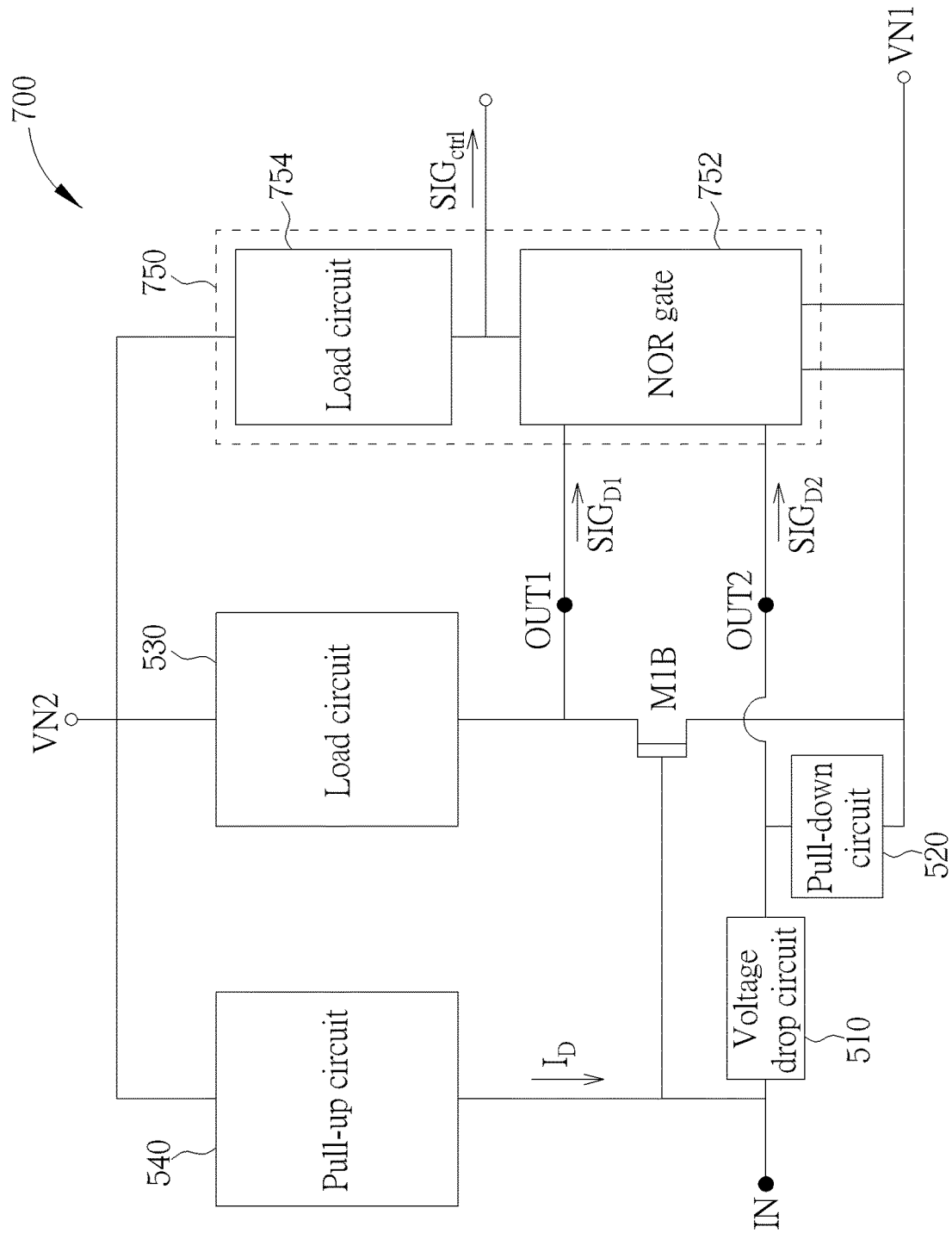
FIG. 7 is a schematic diagram of a voltage state detector according to another embodiment of the invention.

FIG. 7 is a schematic diagram of a voltage state detector 700 according to another embodiment of the invention. The voltage state detector 700 and the voltage state detector 600 are similar in structure and may operate on similar principles. A logic circuit 750 of the voltage state detector 700 may include a NOR gate 752 and a load circuit 754.

The NOR gate 752 has a first input terminal, a second input terminal and an output terminal. The first input terminal of the NOR gate 752 is coupled to the output terminal OUT1, the second input terminal of the NOR gate 752 is coupled to the output terminal OUT2, and the output terminal of the NOR gate 752 may output the control signal $SIG_{ctrl}$.

The load circuit 754 has a first terminal and a second terminal. The first terminal of the load circuit 754 is coupled to the reference terminal VN2, and the second terminal of the load circuit 754 is coupled to the output terminal of the NOR gate 752.

The voltage state detector 700 may output different voltage levels of the control signals $SIG_{ctrl}$ according to the voltage state of the input terminal IN. For example, according to FIG. 5, when the voltage state of the input terminal IN is in the floating state, the output terminal OUT1 will output the state determination signal $SIG_{D1}$ having the low voltage level, and the output terminal OUT2 will output the state determination signal $SIG_{D2}$ having the low voltage level. As a result, the output terminal of the NOR gate 752 may output the control signal $SIG_{ctrl}$ having a high voltage level.

Further, when the voltage state of the input terminal IN is in the high voltage state, the output terminal OUT1 will output the determination signal $SIG_{D1}$ having the low voltage level, and the output terminal OUT2 will output the determination signal $SIG_{D2}$ having the high voltage level. As a result, the output terminal of the NOR gate 752 may output the control signal $SIG_{ctrl}$ having a low voltage level.

Furthermore, when the voltage state of the input terminal IN is in the low state, the output terminal OUT1 will output the determination signal $SIG_{D1}$ having the high voltage level, and the output terminal OUT2 will output the determination signal $SIG_{D2}$ having the low voltage level. As a result, the output terminal of the NOR gate 752 may also output the control signal $SIG_{ctrl}$ having the low voltage level.

In other words, the voltage state of the input terminal may be determined by the control signal $SIG_{ctrl}$. In FIG. 7, when the control signal $SIG_{ctrl}$ is at the high voltage level, the voltage state of the input terminal IN is in the floating state. When the control signal $SIG_{ctrl}$ is at the low voltage level, the voltage state of the input terminal IN is in the high voltage state or in the low voltage state. In other embodiments, the logic circuit 750 may also use other logic operations to generate the control signal $SIG_{ctrl}$ to meet the actual operation requirements of the system.

Figure 8:
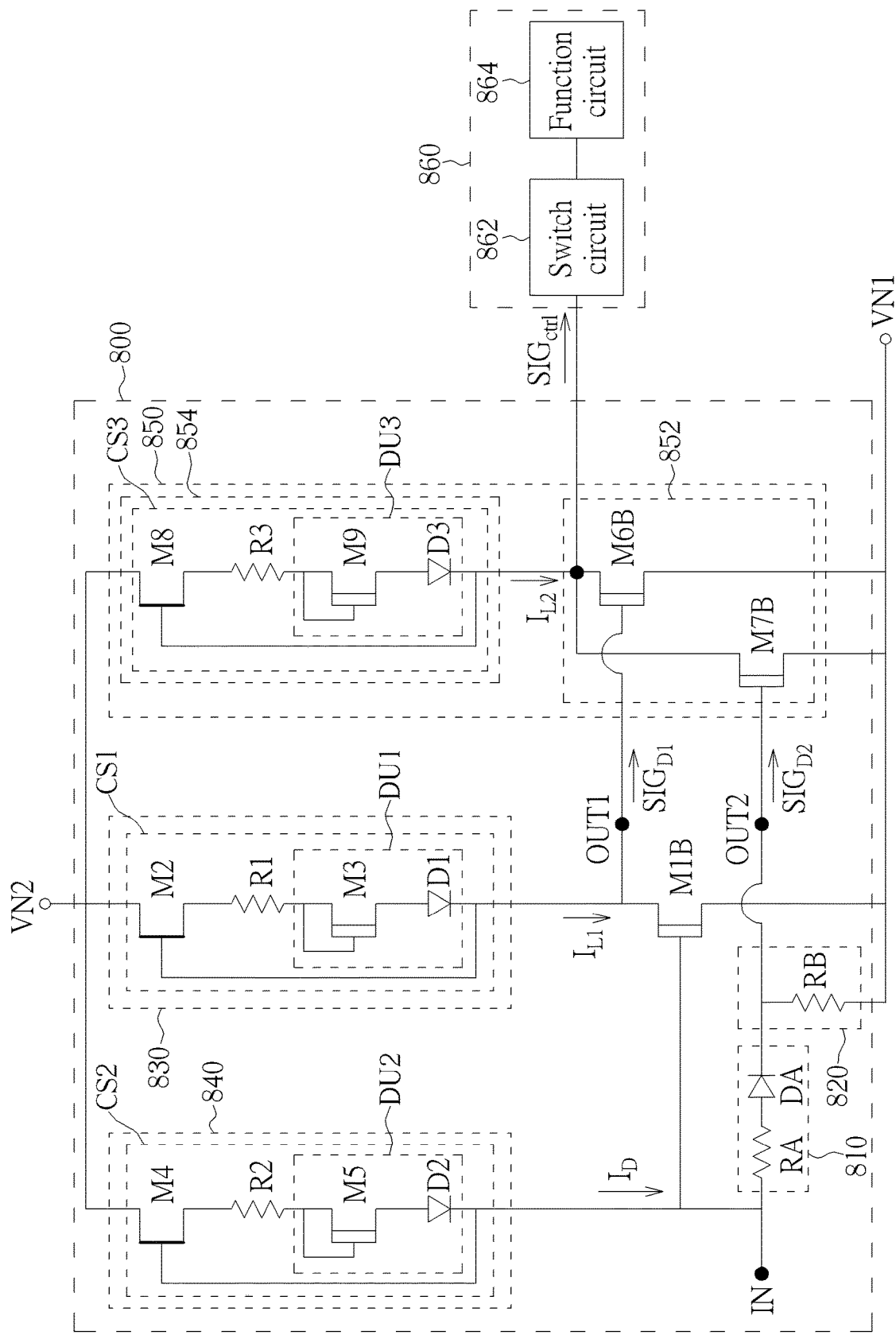
FIG. 8 is an application schematic diagram of a voltage state detector according to another embodiment of the invention.

FIG. 8 is an application schematic diagram of a voltage state detector 800 according to another embodiment of the invention. The voltage state detector 800 may be one of the implementations of the voltage state detector 700 in FIG. 7, and may operate on similar principles. The voltage state detector 800 may include an input terminal IN, an output terminal OUT1, an output terminal OUT2, a voltage drop circuit 810, a pull-down circuit 820, a load circuit 830, a transistor M1B, a pull-up circuit 840 and a logic circuit 850. In some embodiments, the voltage state detector 800 may provide the control signal $SIG_{ctrl}$ for use in an internal circuit 860. In such a case, the logic circuit 850 in the voltage state detector 800 may be coupled to the internal circuit 860.

In the embodiment in FIG. 8, the voltage drop circuit 810 may be implemented by the same structure as the voltage drop circuit 410, the pull-down circuit 820 may be implemented by the same structure as the pull-down circuit 420, and the load circuit 830 may be implemented by the same structure as the load circuit 430, the pull-up circuit 840 may be implemented by the same structure as the pull-up circuit 440, and the internal circuit 860 may be implemented by the same structure as the internal circuit 460, explanation therefor will not be repeated.

The logic circuit 850 may include an NOR gate 852 and a load circuit 854. The NOR gate 852 may include a transistor M6B and a transistor M7B. The transistor M6B has a first terminal, a second terminal and a control terminal. The first terminal of the transistor M6B is coupled to the output terminal of the NOR gate 852, the second terminal of the transistor M6B is coupled to the reference terminal VN1, and the control terminal of the transistor M6B is coupled to the first input terminal of the NOR gate 852. The transistor M7B may include a first terminal, a second terminal and a control terminal. The first terminal of the transistor M7B may be coupled to the first terminal of the transistor M6B, the second terminal of the transistor M7B may be coupled to the reference terminal VN1, and the control terminal of the transistor M7B may be coupled to the second input terminal of the NOR gate 852. In the embodiment in FIG. 8, the load circuit 854 may be implemented by the same structure as the load circuit 454, and the explanation therefor will be omitted for brevity.

In FIG. 8, when the voltage state of the input terminal IN is in the floating state, the state determination signals $SIG_{D1}$ and $SIG_{D2}$ are both at the low voltage level, thereby turning off the transistors M6B and M7B. The voltage at the output terminal of the NOR gate 852 may be regarded as the voltage at the reference terminal VN2, and therefore, the output terminal of the NOR gate 852 may output the control signal $SIG_{ctrl}$ having the high voltage level.

When the voltage state of the input terminal IN is in the high voltage state, the state determination signal $SIG_{D1}$ may be at the low voltage level, and the state determination signal $SIG_{D2}$ may be at the high voltage level, and consequently, the transistor M6B may be turned off and the transistor M7B may be turned on. The voltage at the output terminal of the NOR gate 852 may be pulled down by the transistor M7B to approach the voltage at the reference terminal VN1, and consequently, the output terminal of the NOR gate 852 may output the control signal $SIG_{ctrl}$ having the low voltage level.

When the voltage state of the input terminal IN is in the low voltage state, the state determination signal $SIG_{D1}$ may be at the high voltage level, and the state determination signal $SIG_{D2}$ may be at the low voltage level, and therefore, the transistor M6B may be turned on and the transistor M7B may be turned off. The voltage at the output terminal of the NOR gate 852 may be pulled down by the transistor M6B to approach the voltage at the reference terminal VN1, and consequently, the output terminal of the NOR gate 852 may also output the control signal $SIG_{ctrl}$ having the low voltage level.

In some embodiments, apart from determining the voltage state of the input terminal IN, the state determination signals $SIG_{D1}$ and $SIG_{D2}$ in FIG. 1 or FIG. 5, or the control signals $SIG_{ctrl}$ in FIG. 2, FIG. 3, FIG. 6 or FIG. 7 may further be used by other circuits, or used to directly interact with other circuits, e.g., the state determination signals $SIG_{D1}$ and $SIG_{D2}$ or the control signal $SIG_{ctrl}$ may be used to control a subsequent circuit.

In some embodiments, logic circuits may be selectively configured according to different applications or different system requirements. For example, when the subsequent circuit of the voltage state detector is of a single-ended input type, the logic circuit may be set as shown in FIG. 2, 3, 4, 6, 7 or 8. However, when the subsequent circuit of the voltage state detector is of a double-ended input type, the logic circuit may be omitted, as shown in FIG. 1 or 5.

The transistors M1A, M1B, M3, M5, M9, M6A, M7A, M6B and M7B may be FETs. In some embodiments, the transistors M1A, M1B, M3, M5, M9, M6A, M7A, M6B and M7B may be enhancement mode (E-mode) PHEMTs. When the transistors are E-mode PHEMTs and are diode-connected, the control terminals of the transistors may be coupled to the first terminals thereof, for example, the transistors M3, M5 and M9 in FIG. 4 or FIG. 8. However, when the transistors are D-mode PHEMTs and are diode-connected, the control terminals of the transistors may be coupled to the second terminals thereof. For the transistors M1A to M9, the first terminals may be drain terminals, the second terminals may be source terminals and the control terminals may be gate terminals. The transistors may be fabricated by a gallium arsenide (GaAs) process.

The voltage state detectors provided by the embodiments of the present invention may determine the voltage state of a node of interest, for example, whether it is in a floating state, a high voltage state or a low voltage state. In this manner, the number of the distinguishable voltage states may be increased, enhancing flexibility of a circuit design, and increasing the fields of applications of the voltage state detector.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A voltage state detector comprising:
an input terminal;
a voltage drop circuit comprising a first terminal coupled to the input terminal, and a second terminal;
a pull-down circuit comprising a first terminal coupled to the second terminal of the voltage drop circuit, and a second terminal coupled to a first reference terminal;
a first load circuit comprising a first terminal coupled to a second reference terminal, and a second terminal;

a first transistor comprising a first terminal coupled to the second terminal of the first load circuit, a second terminal coupled to the first reference terminal, and a control terminal;

a pull-up circuit comprising a first terminal coupled to the second reference terminal, and a second terminal coupled to the first terminal of the voltage drop circuit;

a first output terminal coupled to the first terminal of the first transistor, and configured to output a first state determination signal; and a second output terminal configured to output a second state determination signal, wherein the control terminal of the first transistor is coupled to the second terminal of the voltage drop circuit and the second output terminal is coupled to the first terminal of the voltage drop circuit, or the control terminal of the first transistor is coupled to the first terminal of the voltage drop circuit and the second output terminal is coupled to the second terminal of the voltage drop circuit;

wherein the first state determination signal and the second state determination signal are used to determine a voltage state of the input terminal.

2. The voltage state detector of claim 1, wherein the voltage drop circuit comprises at least one transistor, at least one diode, at least one resistor or a combination thereof.

3. The voltage state detector of claim 1, wherein the pull-down circuit comprises at least one transistor, at least one diode, at least one resistor or a combination thereof.

4. The voltage state detector of claim 1, wherein the first load circuit comprises a first current source.

5. The voltage state detector of claim 4, wherein the first current source comprises at least one transistor, at least one diode, at least one resistor or a combination thereof.

6. The voltage state detector of claim 4, wherein the first current source comprises:

a second transistor comprising a first terminal coupled to the first terminal of the first load circuit, a second terminal, and a control terminal;

a first resistor comprising a first terminal coupled to the second terminal of the second transistor, and a second terminal; and a first diode unit comprising a first terminal coupled to the second terminal of the first resistor, and a second terminal coupled to the control terminal of the second transistor and the second terminal of the first load circuit.

7. The voltage state detector of claim 1, wherein the pull-up circuit comprises a second current source.

8. The voltage state detector of claim 7, wherein the second current source comprises at least one transistor, at least one diode, at least one resistor or a combination thereof.

9. The voltage state detector of claim 7, wherein the second current source comprises:

a third transistor comprising a first terminal coupled to the first terminal of the pull-up circuit, a second terminal, and a control terminal;

a second resistor comprising a first terminal coupled to the second terminal of the third transistor, and a second terminal; and a second diode unit comprising a first terminal coupled to the second terminal of the second resistor, and a second terminal coupled to the control terminal of the third transistor and the second terminal of the pull-up circuit.

10. The voltage state detector of claim 1, further comprising:

a logic circuit is coupled to the first output terminal and the second output terminal, and configured to generate a control signal according to the first state determination signal and the second state determination signal, wherein the control signal is related to the voltage state of the input terminal.

11. The voltage state detector of claim 10, wherein when the control terminal of the first transistor is coupled to the second terminal of the voltage drop circuit, and the second output terminal is coupled the first terminal of the voltage drop circuit, the logic circuit comprises:

a NAND gate comprising a first input terminal coupled to the first output terminal, a second input terminal coupled to the second output terminal, and an output terminal configured to output the control signal.

12. The voltage state detector of claim 11, wherein the logic circuit further comprises:

a second load circuit comprising a first terminal coupled to the second reference terminal, and a second terminal coupled to the output terminal of the NAND gate.

13. The voltage state detector of claim 12, wherein the NAND gate comprises:

a fourth transistor comprising a first terminal coupled to the output terminal of the NAND gate, a second terminal, and a control terminal coupled to the first input terminal of the NAND gate; and a fifth transistor comprising a first terminal coupled to the second terminal of the fourth transistor, a second terminal coupled to the first reference terminal, and a control terminal coupled to the second input terminal of the NAND gate.

14. The voltage state detector of claim 12, wherein the second load circuit comprises a third current source, the third current source comprising:

a sixth transistor comprising a first terminal coupled to the first terminal of the second load circuit, a second terminal, and a control terminal;

a third resistor comprising a first terminal coupled to the second terminal of the sixth transistor, and a second terminal; and a third diode unit comprising a first terminal coupled to the second terminal of the third resistor, and a second terminal coupled to the control terminal of the sixth transistor and the second terminal of the second load circuit.

15. The voltage state detector of claim 10, wherein:

the logic circuit is further coupled to an internal circuit, and the control signal is further used to switch an operating state of the internal circuit.

16. The voltage state detector of claim 1, wherein the voltage state of the input terminal comprises a floating state.

* * * * *